United States Patent
Nishimura et al.

(10) Patent No.: US 7,405,622 B2
(45) Date of Patent: Jul. 29, 2008

(54) OPERATIONAL AMPLIFIER WITH LESS OFFSET

(75) Inventors: Kouichi Nishimura, Kanagawa (JP); Atsushi Shimatani, Kanagawa (JP); Motoyasu Ichimura, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 131 days.

(21) Appl. No.: 11/398,546

(22) Filed: Apr. 6, 2006

(65) Prior Publication Data

US 2006/0226877 A1    Oct. 12, 2006

(30) Foreign Application Priority Data

Apr. 7, 2005   (JP) ............................. 2005-110646

(51) Int. Cl.
  *H03F 3/26*   (2006.01)
(52) U.S. Cl. ....................... 330/255; 330/267
(58) Field of Classification Search ................. 330/255, 330/267
  See application file for complete search history.

(56) References Cited

U.S. PATENT DOCUMENTS 5,311,145 A * 5/1994 Huijsing et al. ............. 330/255

FOREIGN PATENT DOCUMENTS

JP   61-35004   2/1986

* cited by examiner

*Primary Examiner*—Steven J Mottola
(74) *Attorney, Agent, or Firm*—McGinn IP Law Group, PLLC

(57) ABSTRACT

A differential amplifier includes an input stage circuit including a first differential pair and a second differential pair which are complementary to each other; a first current mirror circuit connected with the first differential pair and configured to function as an active load; a second current mirror circuit connected with the second differential pair and configured to function as an active load; an output stage circuit having a pair of output transistors connected in series between a higher power supply and a lower power supply; an operation point setting circuit configured to set an operation point of the output transistors; and a floating constant current source connected between an input terminal of the first current mirror circuit and an input terminal of the second current mirror circuit, and configured to supply a constant current. The first current mirror circuit and the second current mirror circuit supply superimpose an output of the input stage circuit on a current corresponding to the constant current by the floating constant current source to supply to the operation point setting circuit.

20 Claims, 7 Drawing Sheets

OPERATIONAL AMPLIFIER WITH LESS OFFSET

BACKGROUND OF THE INVENTION

1. Field of the Invention

The present invention relates to an operational amplifier, and more particularly relates to an operational amplifier suitable to drive a capacitive load.

2. Description of the Related Art

An operational amplifier is conventionally formed from bipolar transistors. However, in recent years, the operational amplifier is often formed from MOS transistors because of the necessity of coexistence with a MOS circuit and the request of a low power. It is possible to employ a circuit configuration of the operational amplifier of the MOS transistors by using the analog characteristics peculiar to the MOS transistors, and the configuration is different from the operational amplifier of the bipolar transistors. As one of the application fields of the operational amplifier of the MOS transistors, there is a TFT_LCD (Thin Film Transistor Liquid Crystal Display) driver LSI. This LCD driver LSI contains a plurality of operational amplifiers each having a voltage follower configuration as buffer circuits. In particular, a device having a small offset voltage difference between the plurality of operational amplifiers is required. This is because the characteristics of the TFT LCD causes even the voltage difference of 10 mV to be recognized as a different gradation by the eye of a human. Thus, this field requires the MOS operational amplifier of the very small offset voltage.

FIG. 1 is a circuit diagram showing the configuration of the operational amplifier disclosed in Japanese Laid Open Patent Publication (JP-A-Showa, 61-35004). This conventional operational amplifier is a typical amplifier with a class AB output circuit and includes a driver circuit 1, P-channel MOS transistors 2 and 3, N-channel MOS transistors 4 and 5 and constant current sources 8 and 9. The output of the driver circuit 1 is connected to a drain of the P-channel MOS transistor 2, a source of the N-channel MOS transistor 4, a gate of the N-channel MOS transistor 5 and a constant current source 9 to drive the output circuit based on a signal supplied to an input terminal. The other end of the constant current source 9 is connected to a negative voltage power source $V_{SS2}$. A source of the N-channel MOS transistor 5 is also connected to the negative voltage power source $V_{SS2}$, and a drain thereof is connected to an output terminal VOUT and a drain of the P-channel MOS transistor 3. A source of the P-channel MOS transistor 3 is connected to a positive voltage source $V_{DD2}$, and a gate thereof is connected to the constant current source 8, a source of the P-channel MOS transistor 2 and a drain of the N-channel MOS transistor 4. The other end of the constant current source 8 is also connected to the positive voltage source $V_{DD2}$. A gate of the P-channel MOS transistor 2 is connected through a constant voltage source 6 to the positive voltage source $V_{DD2}$, and biased lower by a constant voltage than the positive voltage source VDD2. A gate of the N-channel MOS transistor 4 is connected through a constant voltage source 7 to the negative voltage power source VSS2 and biased higher by a constant voltage than the negative voltage power source.

When this amplifier is used as an operational amplifier, the driver circuit 1 is usually constituted of a differential amplifier. FIG. 2 shows a circuit example of the differential amplifier. This differential amplifier includes P-channel MOS transistors 10 and 11 of a differential pair, N-channel MOS transistors 12 and 13 of a current mirror circuit, and a constant current source 14. Gates of the P-channel MOS transistors 10 and 11 are connected to a negative inversion input terminal Vin (−) and a positive input terminal Vin (+), respectively. The constant current source 14 is connected between sources of the P-channel MOS transistors 10 and 11 and the positive voltage source $V_{DD2}$. A source of the N-channel MOS transistor 12 is connected to the negative voltage power source $V_{SS2}$, and a gate and drain are connected to a drain of the P-channel MOS transistor 10. A source of the N-channel MOS transistor 13 is connected to the negative voltage power source $V_{SS2}$, and a gate is connected to a gate of the N-channel MOS transistor 12, and a drain thereof is connected to a drain of the P-channel MOS transistor 11. A node to which the drain of the P-channel MOS transistor 11 and the drain of the N-channel MOS transistor 13 are connected serves as an output terminal Vout1 of the differential amplifier. The output terminal Vout1 serves as the output of the driver circuit 1 and is connected to the gate of the N-channel MOS transistor 5 of the amplifier shown in FIG. 1. The differential input signals, which are applied to the negative input terminal Vin (−) and the positive input terminal Vin (+), are received by the P-channel MOS transistors 10 and 11. The outputs from the differential pair appear in the drains of the P-channel MOS transistors 10 and 11. The differential output signals are supplied to the current mirror circuit (the N-channel MOS transistors 12 and 13) serving as the active load. The N-channel MOS transistors 12 and 13 convert the differential output signals into a single end signal, which is outputted from the output terminal Vout1. At this differential stage, the input voltage range is represented by the following equation when the input voltage is assumed to be Vin.

$$0 < Vin < V_{GS(10/11)} + V_{DS(sat)(14)}$$

Here, $V_{GS(10/11)}$ is the voltage between the gate and the source of each of the P-channel MOS transistors 10 and 11, and $V_{DS(sat)(14)}$ is the voltage between the drain and the source at the saturation point of the P-channel MOS transistor of the constant current source 14. Outside this range, the voltage between the drain and the source of the MOS transistor of the constant current source 14 cannot be generated. Thus, a current I of the constant current source 14 is 0. Therefore, the differential stage does not operate outside this range.

On the contrary, an example of a circuit that insures the operations in the whole voltage range is a so-called Rail-to-Rail amplifier shown in FIG. 3. This differential amplifier includes P-channel MOS transistors 19 and 20 of a P-channel differential pair 31; N-channel MOS transistors 21 and 22 of an N-channel differential pair 32; N-channel MOS transistors 23 and 24 of a current mirror circuit 35; P-channel MOS transistors 15 and 16 of a current mirror circuit 33; P-channel MOS transistors 17 and 18 of a current mirror circuit 34; and constant current sources 25 and 26.

The negative input terminal Vin (−) and the positive input terminal Vin (+) are connected to gates of the P-channel MOS transistors 19 and 20 and gates of the N-channel MOS transistors 21 and 22, respectively. Sources of the P-channel MOS transistors 19 and 20 are commonly connected to each other and connected through a constant current source 26 to the positive voltage source $V_{DD2}$. Drains of the P-channel MOS transistors 19 and 20 are connected to drains of the N-channel MOS transistors 23 and 24, respectively, and further connected to drains of the P-channel MOS transistors 18 and 15. Gates of the N-channel MOS transistors 23 and 24 are commonly connected to each other and further connected to the drain of the N-channel MOS transistor 23 and serves as an input terminal of the current mirror circuit 35. Also, sources of the N-channel MOS transistors 23 and 24 are commonly connected to each other and connected to the negative voltage power source $V_{SS2}$ as the common terminal of the current mirror circuit 35. Sources of the N-channel MOS transistors 21 and 22 are commonly connected to each other and connected through a constant current source 25 to the negative voltage power source $V_{SS2}$. Drains of the N-channel MOS transistors 21 and 22 are connected to the input terminals of the current mirror circuits 33 and 34, respectively. The input terminal of the current mirror circuit 33 is the node to which the gates of the P-channel MOS transistors 15 and 16 are commonly connected and connected to the drain of the P-channel MOS transistor 16. The sources of the P-channel MOS transistors 15 and 16 are commonly connected and connected to the positive voltage source $V_{DD2}$ as the common terminal of the current mirror circuit 33. The input terminal of the current mirror circuit 34 is the node to which the gates of the P-channel MOS transistors 17 and 18 are commonly connected and connected to the drain of the P-channel MOS transistor 17. The sources of the P-channel MOS transistors 17 and 18 are commonly connected to each other and connected to the positive voltage source $V_{DD2}$ as the common terminal of the current mirror circuit 34. The node where the drains of the P-channel MOS transistors 15 and 20 and N-channel MOS transistor 24 are commonly connected is the output terminal Vout2 of this differential amplifier (the driver circuit 1) and connected to the gate of the N-channel MOS transistor 5 in FIG. 1.

This circuit serves as the differential stage where the P-channel differential pair 31 and the N-channel differential pair 32 are combined. Thus, the output of the P-channel differential pair 31 and the output of the N-channel differential pair 32 are required to be added. For this reason, the respective drains of the transistors constituting the N-channel differential pair 32 are connected to the input terminals of the respective current mirror circuits 33 and 34. The currents outputted from the output terminals of the current mirror circuits 33 and 34 flow through the respective drains of the N-channel MOS transistors 24 and 23, and the outputs are added. Consequently, in case of the voltage range in which the P-channel differential pair 31 does not operate, the N-channel differential pair 32 operates. On the contrary, in case of the voltage range in which the N-channel differential pair 32 does not operate, the P-channel differential pair 31 operates. Thus, the differential stage operating in the whole voltage range is obtained.

In order to use such a driver circuit 1 so that the output stage of the operational amplifier circuit shown in FIG. 1 carries out the operation of the so-called class AB, an idling current is required to flow through the P-channel MOS transistor 3 and the N-channel MOS transistor 5. The current value is determined by the P-channel MOS transistor 2, the N-channel MOS transistor 4, the constant current sources 8 and 9 and the constant voltage sources 6 and 7, which constitute an operational point setting circuit. At this time, the voltages of the constant voltage sources 6 and 7 are set such that the respective drain currents of the P-channel MOS transistor 2 and N-channel MOS transistor 4 are equal to each other. That is, each drain current is a half of the current flowing out from the constant current source 8. At this time, the idling current of the P-channel MOS transistor 3 at the output stage is set by the constant voltage source 6 and the voltage between the gate and the source of the P-channel MOS transistor 2 biased by the current which is a half of the current of the constant current source 8.

Also, the current which flows out from the constant current source 8 flows through the P-channel MOS transistor 2 and the N-channel MOS transistor 4 into the constant current source 9. When the constant current values of the constant current sources 8 and 9 are different, the current corresponding to the difference flows in from the node between the constant current sources 8 and 9 or flows out from the node. Thus, it could be understood that when the constant current values of the constant current sources 8 and 9 are made equal to each other, the current does not flow into the output of the driver circuit 1. This fact is very important when the driver circuit 1 is configured from the circuit shown in FIG. 2 or 3. That is, it is supposed that the output current flows into the driver circuit 1 as shown in FIG. 2 or 3. Then, a differential offset voltage corresponding to the current is generated. Specifically, when a mutual conductance of the differential transistor is assumed to be gm and the current flowing to the output is assumed to be Iout, the differential offset voltage Vos is obtained from the following equation. Thus, in order to prevent the generation of the offset voltage, the constant current values of the constant current sources 8 and 9 are required to be equal to each other.

$$V_{os} = I_{out}/g_m$$

As mentioned above, the conventional circuit requires the current value matching performance between the constant current source 8 and the constant current source 9, in order to couple the amplifying circuit shown in FIG. 2 or 3 as the driver circuit of the differential amplifier shown in FIG. 1. However, when this differential amplifier is configured inside LSI, it is difficult to match the elements perfectly due to the deviation in the property between the respective elements. That is, the variation in the property between the respective elements causes the differential current between the constant current source 8 and the constant current source 9 to flow into the output terminal (the Vout1 in FIG. 2 and the Vout2 in FIG. 3) in the driver circuit 1. Thus, the offset voltage is generated.

SUMMARY OF THE INVENTION

In an aspect of the present invention, a differential amplifier includes an input stage circuit including a first differential pair and a second differential pair which are complementary to each other; a first current mirror circuit connected with the first differential pair and configured to function as an active load; a second current mirror circuit connected with the second differential pair and configured to function as an active load; an output stage circuit having a pair of output transistors connected in series between a higher power supply and a lower power supply; an operation point setting circuit configured to set an operation point of the output transistors; and a floating constant current source connected between an input terminal of the first current mirror circuit and an input terminal of the second current mirror circuit, and configured to supply a constant current. The first current mirror circuit and the second current mirror circuit supply superimpose an output of the input stage circuit on a current corresponding to the constant current by the floating constant current source to supply to the operation point setting circuit.

Here, the operation point setting circuit may include a pair of complimentary transistors; and a bias setting circuit configured to set a bias to each of the complimentary transistors of the pair. A current flowing out from the first current mirror circuit may flow into the second current mirror circuit through the pair of complimentary transistors, and an operation points of the output transistors may be set based on a gate-source voltage in the complimentary transistors through the flow out of the current and the biases.

Also, the first differential pair may include a first N-channel MOS transistor and a second N-channel MOS transistor, whose sources are connected to each other in common. A gate of the first N-channel MOS transistor and a gate of the second N-channel MOS transistor may be connected with differential input terminals, respectively. A drain of the first N-channel MOS transistor may be connected with an input terminal of the first current mirror circuit, and a drain of the second N-channel MOS transistor may be connected with an output terminal of the first current mirror circuit. The second differential pair may include a first P-channel MOS transistor and a second P-channel MOS transistor whose sources are connected with in common. A gate of the first P-channel MOS transistor of and a gate of the second P-channel MOS transistor may be connected with the differential input terminals, respectively. A drain of the first P-channel MOS transistor may be connected with an input terminal of the second current mirror circuit, and a drain of the second P-channel MOS transistor may be connected with an output terminal of the second current mirror circuit.

Also, the floating constant current source may include a P-channel MOS transistor; an N-channel MOS transistor; a first constant voltage source configured to give a bias to a gate of the P-channel MOS transistor; and a second constant voltage source configured to give a bias to a gate of the N-channel MOS transistor. A source of the P-channel MOS transistor and a drain of the N-channel MOS transistor may be connected to form one of terminals of the floating constant current source, and a drain of the P-channel MOS transistor and a source of the N-channel MOS transistor may be connected to form the other terminal of the floating constant current source.

In this case, the first constant voltage source may include two P-channel MOS transistors connected in series, and the second constant voltage source may include two N-channel MOS transistors connected in series.

Also, the first constant voltage source may include a third P-channel MOS transistor; a fourth P-channel MOS transistor; and a first constant current source, which are connected between of higher and lower power supply lines in series. The second constant voltage source may include a third N-channel MOS transistor; a fourth N-channel MOS transistor; and a second constant current source, which are connected between the higher and lower power supply lines in series. A source of the fourth P-channel MOS transistor may be connected with a node to which a gate and a drain of the third P-channel MOS transistor are connected, and one of terminals of the first constant current source may be connected with a node to which a gate and a drain of the fourth P-channel MOS transistor are connected. A source of the fourth N-channel MOS transistor may be connected with a node to which a gate and a drain of the third N-channel MOS transistor may be connected, and one of terminals of the second constant current source may be connected with a node to which a gate and a drain of the fourth N-channel MOS transistor may be connected.

Also, the floating constant current source may include fifth and sixth P-channel MOS transistors whose gates are connected with each other; fifth and sixth N-channel MOS transistors whose gates are connected with each other; a third constant voltage source; and a third constant current source. The third constant voltage source, the sixth P-channel MOS transistor, the sixth N-channel MOS transistor and the third constant current source may be connected between the higher and lower power supply lines in series. A drain and a gate of the sixth P-channel MOS transistor may be connected with each other, and a drain and a gate of the sixth N-channel MOS transistor may be connected with each other.

In another aspect of the present invention, an operational amplifier includes an N-channel differential transistor pair connected with input terminals; a P-channel differential transistor pair connected with the input terminals; a first current mirror circuit provided between a higher power supply line and the N-channel differential transistor pair to have input and output terminals connected with differential outputs of the N-channel differential transistor pair; a second current mirror circuit provided between a lower power supply line and the P-channel differential transistor pair to have input and output terminals connected with differential outputs of the P-channel differential transistor pair; a floating constant current source having one terminal connected with the input terminal of the first current mirror circuit and the other terminal connected with the input terminal of the second current mirror circuit; a P-channel MOS transistor having a source connected with the output terminal of the first current mirror circuit, a gate connected with a first constant voltage source, and a drain connected with the output terminal of the second current mirror circuit; an N-channel MOS transistor having a source connected with the output terminal of the second current mirror circuit, a gate connected with a second constant voltage source and a drain connected with the output terminal of the first current mirror circuit; an output stage P-channel MOS transistor connected between an external output terminal and the higher power supply line and having a gate connected with the output terminal of the first current mirror circuit; and an output stage N-channel MOS transistor connected between the external output terminal and the lower power supply line and having a gate connected with the output terminal of the second current mirror circuit.

Here, the floating constant current source may include a first constant voltage source connected with the higher power supply line; a second constant voltage source connected with the lower power supply line; a P-channel MOS transistor having a source connected with the input terminal of the first current mirror circuit, a gate connected with the first constant voltage source, a drain connected with the input terminal of the second current mirror circuit; and an N-channel MOS transistor having a gate connected with the second constant voltage source, a source connected with the input terminal of the second current mirror circuit and a drain connected with the input terminal of the first current mirror circuit.

Also, the floating constant current source may include a first N-channel MOS transistor having a gate and a drain connected with in common; a first P-channel MOS transistor having a source connected with a source of the first N-channel MOS transistor and a gate and a drain connected with in common; a second N-channel MOS transistor having a gate connected with the gate of the first N-channel MOS transistor and a drain connected with the input terminal of the first current mirror circuit; a second P-channel MOS transistor having a gate connected with the gate of the first P-channel MOS transistor, a drain connected with the input terminal of the second current mirror circuit and a source connected with the source of the second N-channel MOS transistor; a constant current source connected between the higher power supply line and the gate and drain of the first N-channel MOS transistor; and a constant voltage source connected with the gate and drain of the first P-channel MOS transistor.

DESCRIPTION OF THE PREFERRED EMBODIMENTS

Figure 4:
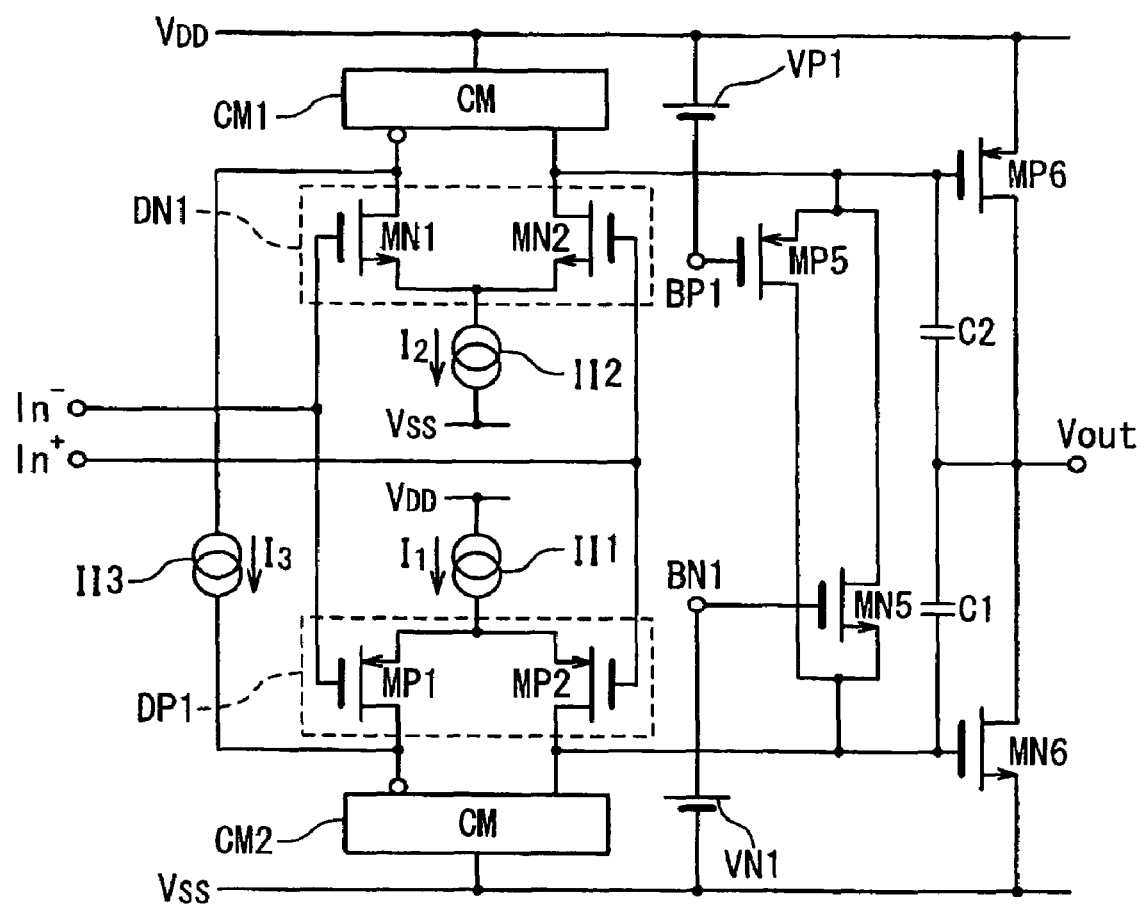
FIG. 4 is a circuit diagram showing a configuration of an operational amplifier according to an embodiment of the present invention.

Hereinafter, an operational amplifier with a differential amplifier of the present invention will be described in detail with reference to the attached drawings. FIG. 4 shows an equivalent circuit of the operational amplifier according to the present invention. The operational amplifier includes an N-channel differential pair DN1 having an N-channel MOS transistor MN1 and an N-channel MOS transistor MN2; a P-channel differential pair DP1 having a P-channel MOS transistor MP1 and a P-channel MOS transistor MP2; current mirror circuits CM1 and CM2; constant current sources I1, I2 and I3; constant voltage sources VP1 and VN1; P-channel MOS transistors MP5 and MP6; N-channel MOS transistors MN5 and MN6; and capacitors C1 and C2.

In the N-channel differential pair DN1, gates of the N-channel MOS transistors MN1 and MN2 are connected to a negative input terminal In− and a positive input terminal In+, respectively, and drains thereof are connected to an input terminal and an output terminal of the current mirror circuit CM1, respectively, and sources thereof are connected to each other and connected to the constant current source I2. In the P-channel differential pair DP1, drains of the P-channel MOS transistors MP1 and MP2 are connected to an input terminal and an output terminal of the current mirror circuit CM2, respectively, and gates thereof are connected to the negative input terminal In− and the positive input terminal In+, respectively, and sources thereof are connected to each other and connected to the constant current source I1.

One terminal of the constant current source I1 is connected to a positive voltage power source $V_{DD}$, and a current $I_1$ is sent from the positive voltage power source $V_{DD}$ to the P-channel differential pair DP1. One terminal of the constant current source I2 is connected to a negative voltage power source $V_{SS}$, and a current $I_2$ is sent from the N-channel differential pair DN1 to the negative voltage power source $V_{SS}$.

In the current mirror circuit CM1, the common terminal is connected to the positive voltage power source $V_{DD}$, the input terminal is connected to the drain of the N-channel MOS transistor MN1, and the output terminal is connected to the drain of the N-channel MOS transistor MN2, the source of the P-channel MOS transistor MP5, the drain of the N-channel MOS transistor MN5 and the gate of the P-channel MOS transistor MP6. In the current mirror circuit CM2, the common terminal is connected to the negative voltage power source $V_{SS}$, the input terminal is connected to the drain of the P-channel MOS transistor MP1, and the output terminal is connected to the drain of the P-channel MOS transistor MP2, the source of the N-channel MOS transistor MN5, the drain of the P-channel MOS transistor MP5 and the gate of the N-channel MOS transistor MP6. Moreover, the constant current source I3 is connected between those current mirror circuits CM1 and CM2. In the constant current source I3, a current $I_3$ is sent from the current mirror circuit CM1 to the current mirror circuit CM2.

The gate of the P-channel MOS transistor MP5 is connected through the constant voltage source VP1 to the positive voltage power source $V_{DD}$. Thus, the gate of the P-channel MOS transistor MP5 is biased lower by a constant voltage $V_{P1}$ than the voltage of the positive voltage power source $V_{DD}$. The connection point between the gate of the P-channel MOS transistor MP5 and the constant voltage source VP1 is assumed to be a node BP1. The gate of the N-channel MOS transistor MN5 is connected through a constant voltage source VN1 to the negative voltage power source $V_{SS}$. Thus, the gate of the N-channel MOS transistor MN5 is biased higher by a constant voltage $V_{N1}$ than the potential of the negative voltage power source $V_{SS}$. The connection point between the gate of the N-channel MOS transistor MN5 and the constant voltage source VN1 is assumed to be a node BN1.

The source of the P-channel MOS transistor MP6 is connected to the positive voltage power source $V_{DD}$, and the source of the N-channel MOS transistor MN6 is connected to the negative voltage power source $V_{SS}$. The drain of the P-channel MOS transistor MP6 and the drain of the N-channel MOS transistor MN6 are connected to an output terminal Vout. A capacitor C2 is connected between the output terminal Vout and the gate of the P-channel MOS transistor MP6, and a capacitor C1 is connected between the output terminal Vout and the gate of the N-channel MOS transistor MN6.

Figure 1:
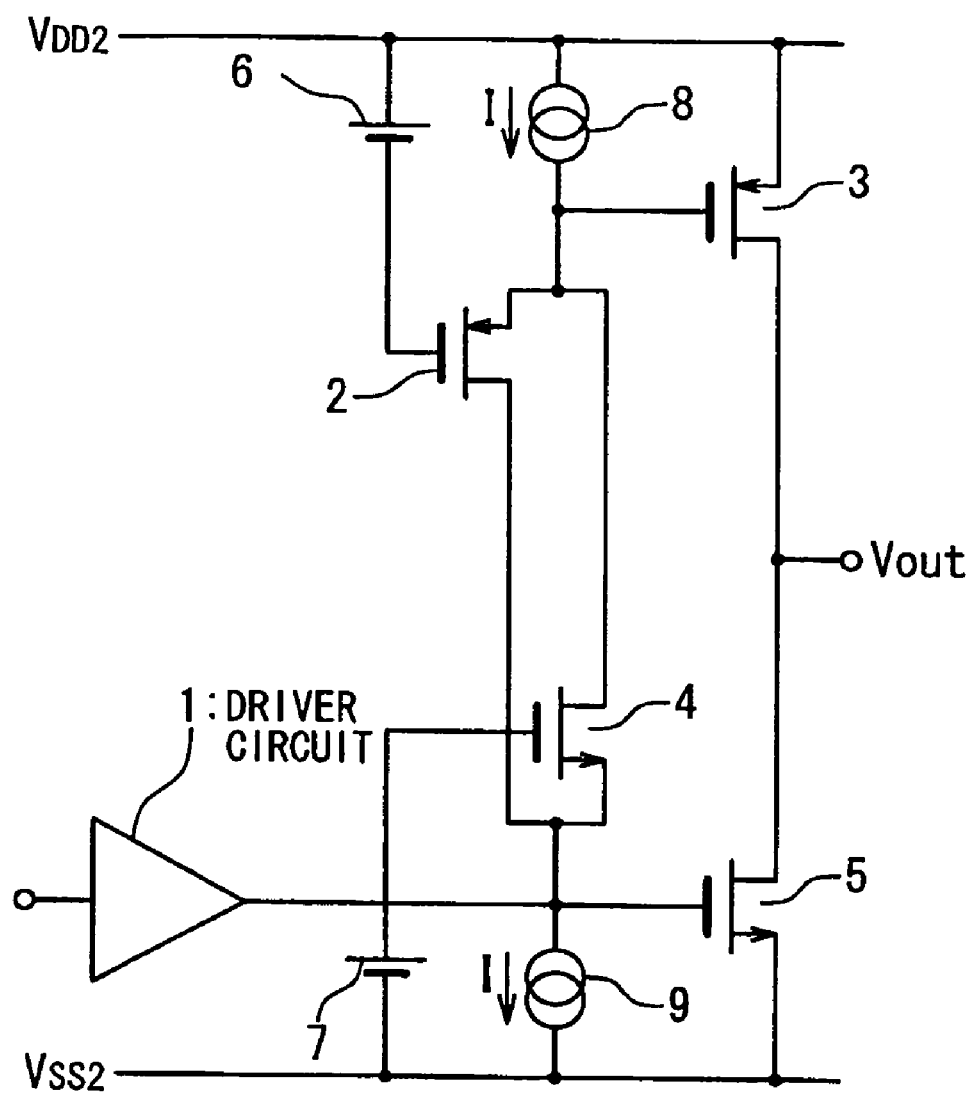
FIG. 1 is a circuit diagram showing a configuration of a conventional operational amplifier.
Figure 2:
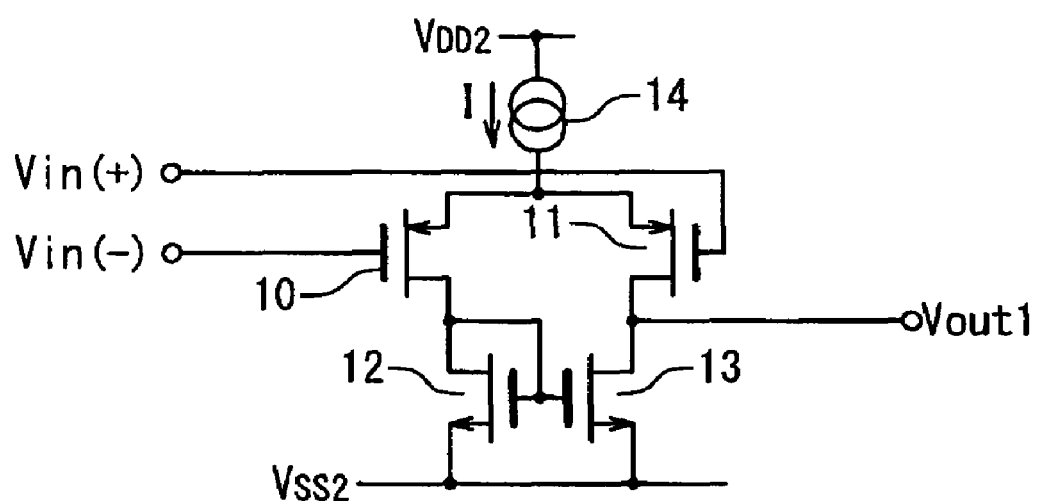
FIG. 2 is a circuit diagram showing a configuration of a conventional driver circuit.
Figure 3:
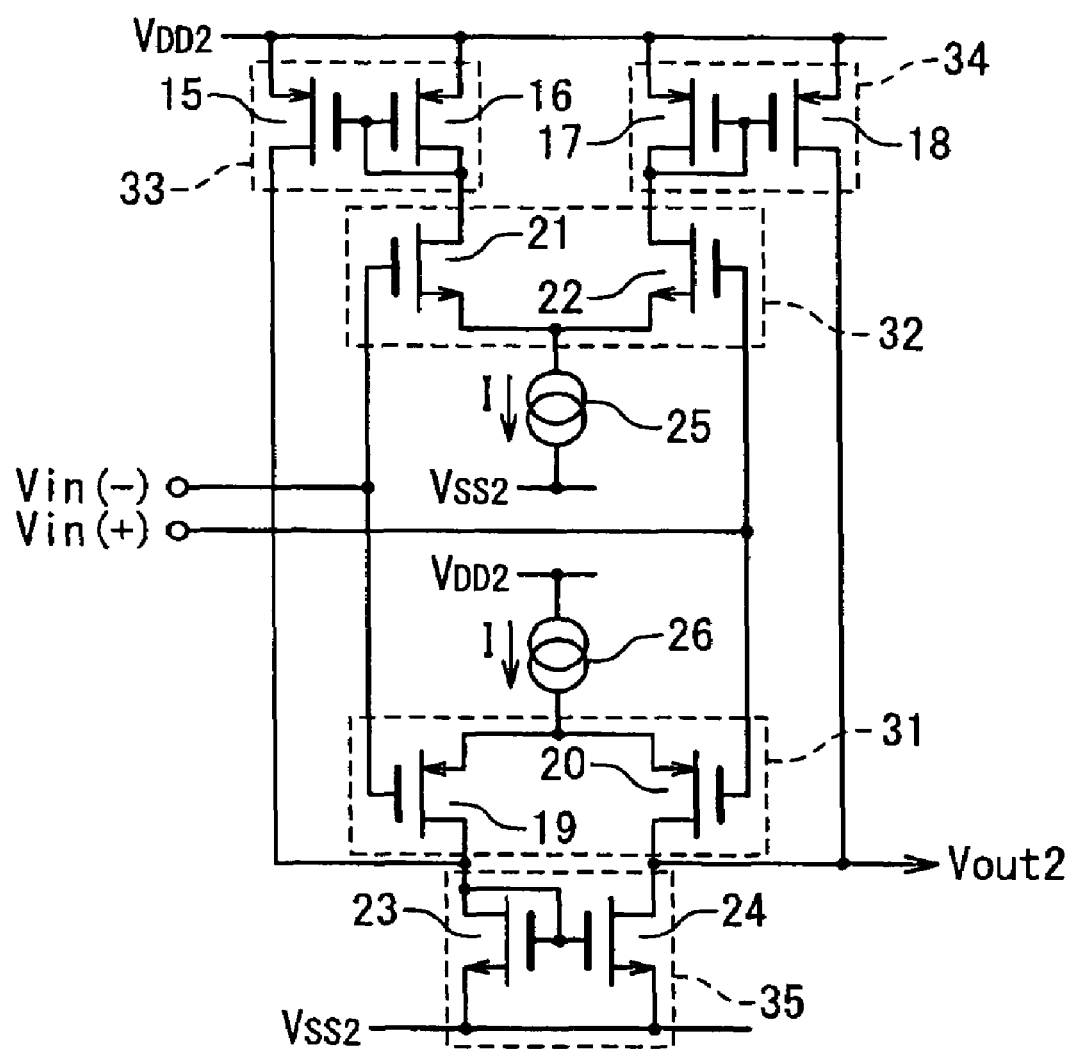
FIG. 3 is a circuit diagram showing a configuration of a conventional driver circuit of an Rail-to-Rail system.

As compared with the circuit shown in FIG. 1, in the operational point setting circuit shown in FIG. 4, it could be understood that the currents are supplied from the current mirror circuits CM1 and CM2 instead of the constant current sources 8 and 9 of the operational point setting circuit in FIG. 1, excluding the addition of the capacitors. That is, the P-channel MOS transistors 2 and 3 and the N-channel MOS transistors 4 and 5 in FIG. 1 correspond to the P-channel MOS transistors MP5 and MP6 and the N-channel MOS transistors MN5 and MN6 in FIG. 4, respectively. Also, the constant voltage sources 6 and 7 in FIG. 1 correspond to the constant voltage sources VP1 and VN1 in FIG. 4.

An output signal of the N-channel differential pair DN1 is supplied to the gate of the P-channel MOS transistor MP6 (output transistor). An output signal of the P-channel differential pair DP1 is supplied to the gate of the N-channel MOS transistor MN6 (output transistor). Consequently, the respective output signals are added to each other, and an addition resultant signal is then outputted from the output terminal Vout. In the circuit of FIG. 1, in order to prevent the generation of the offset voltage, the current value matching performance between the constant current sources 8 and 9 is important. In this embodiment, the current mirror circuits CM1 and CM2 are used to operate even as the active loads instead of those constant current sources. The constant current source I3 is connected between the input terminals of those current mirror circuits CM1 and CM2. This constant current source I3 serves as a floating current source, and sends a current $I_3$ from the input terminal of the current mirror circuit CM1 to the direction of the input terminal of the current mirror circuit CM2. With such connection, the output of the current mirror circuit CM1 carries out the same action as the constant current source 8 shown in FIG. 1. Also, the output of the current mirror circuit CM2 carries out the same operation as the constant current source 9 shown in FIG. 1. That is, the active load functions as the constant current source.

In this way, since the floating constant current source I3 is connected between the input terminal of the current mirror circuit CM1 and the input terminal of the current mirror circuit CM2, the input currents of the current mirror circuits CM1 and CM2 are accurately equal to each other. Thus, the output currents thereof are equal to each other. That is, the current matching performance is sufficiently satisfied, and the offset voltage is never generated in the output of the differential amplifier. In this way, with the circuit configuration shown in FIG. 4, the Rail-to-Rail amplifier is attained which can be operated even when the input/output signal is in the whole range of the power source voltage, and the offset voltage of this amplifier can be reduced. Also, according to this circuit configuration, the two current sources requiring the relatively high precision can be attained under the simple circuit configuration.

Here, the AB class operation of the output stages of the P-channel MOS transistor MP6 (output transistor), the N-channel MOS transistor MN6 (output transistor), the P-channel MOS transistor MP5, the N-channel MOS transistor MN5, the constant voltage source VP1 and the constant voltage source VN1 is same as that described in the Japanese Laid Open Patent Publication (JP-A-Showa, 61-35004). Thus, the description is omitted here.

Also, in the circuit shown in FIG. 4, the capacitor C1 and the capacitor C2 are inserted for phase compensation. In the typical MOS amplifier, in order to erase the zero point of a phase delay, there is a case that a resistor is inserted in series with each of those capacitors C1 and C2 (not shown).

In this way, the driver circuit has the differential input stage and the two current mirror circuits and drives the class AB output circuit. The design where the floating constant current source is connected between the current input terminals of those current mirror circuits permits the removal of the two constant current sources that require the relative high precision between the currents. The differential input stage has the differential N-channel MOS transistor and the differential P-channel MOS transistor. The two current mirror circuits serve as the active load of each of the differential N-channel MOS transistor and the differential P-channel MOS transistor, and also achieve the converting function from the differential signal into a single end signal. Thus, under the simple circuit configuration, it is possible to attain the operational amplifier having the small offset voltage and the high precision.

Figure 5:
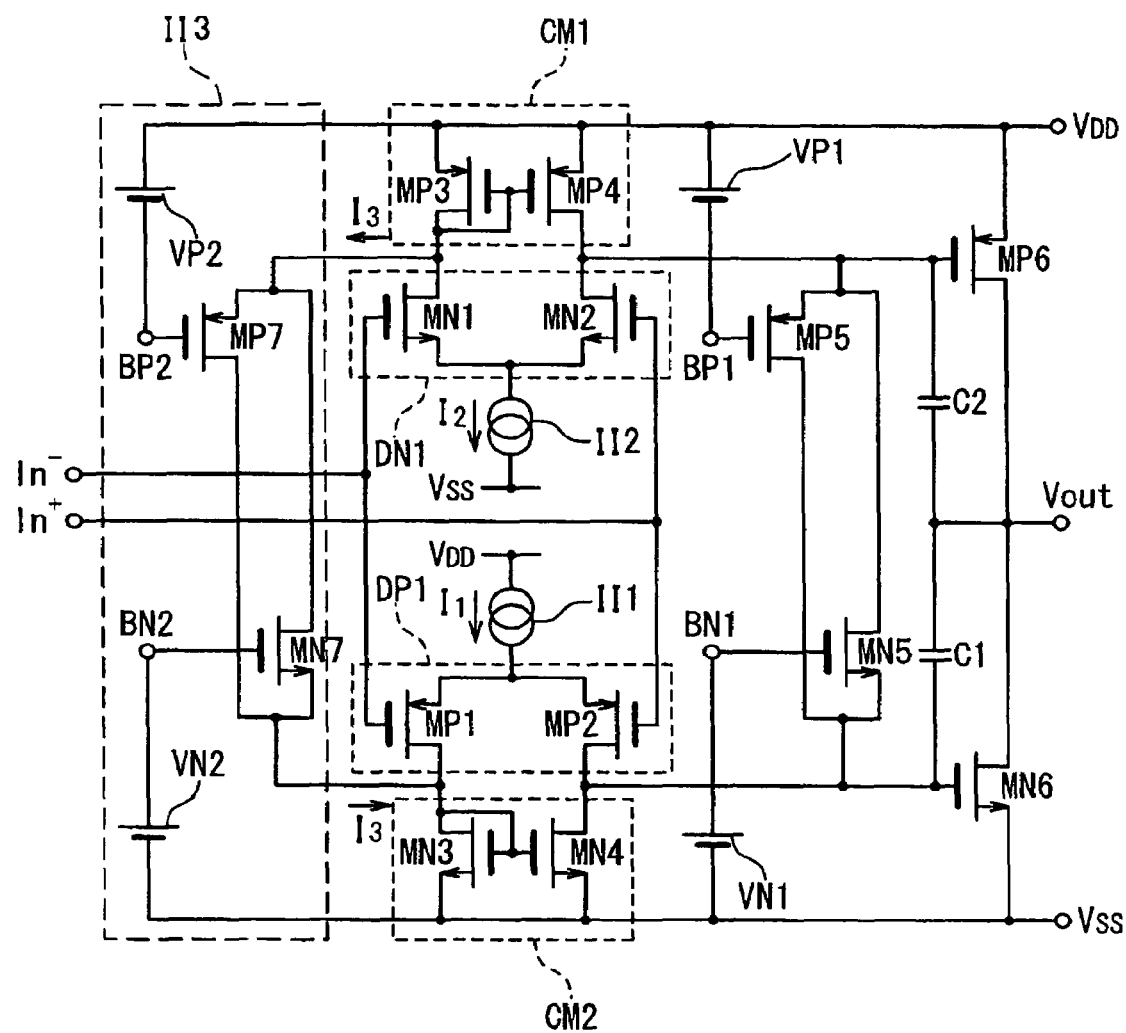
FIG. 5 is a circuit diagram showing a configuration of a floating constant current source shown in FIG. 4.

FIG. 5 shows a circuit diagram showing the circuit configuration of the operational amplifier in which a specific circuit is shown of the current mirror circuits CM1 and CM2 and the floating current source II3, which are shown in FIG. 4. A portion other than them is same as the circuit portion shown in FIG. 4, and the same symbols are allocated. With reference to FIG. 5, the current mirror circuit CM1 has the P-channel MOS transistors MP3 and MP4 in which the gates and sources are commonly connected to each other, respectively. The sources are connected to the positive voltage power source $V_{DD}$ and serves as the common terminal of the current mirror circuit CM1. Also, the gates are connected to the drain of the P-channel MOS transistor MP3 and serves as the input terminal of the current mirror circuit CM1. The drain of the P-channel MOS transistor MP4 serves as the output terminal of the current mirror circuit CM1. The current mirror circuit CM2 has the N-channel MOS transistors MN3 and MN4 in which the gates and sources are commonly connected to each other, respectively. The sources are connected to the negative voltage power source $V_{SS}$ and serves as the common terminal of the current mirror circuit CM2. Also, the gates are connected to the drain of the N-channel MOS transistor MN3 and serves as the input terminal of the current mirror circuit CM2. The drain of the N-channel MOS transistor MN4 serves as the output terminal of the current mirror circuit CM2.

The floating constant current source II3 has a P-channel MOS transistor MP7, an N-channel MOS transistor MN7 and constant voltage sources VP2 and VN2. A source of the P-channel MOS transistor MP7 and a drain of the N-channel MOS transistor MN7 are commonly connected and serve as one terminal of the current source II3, and commonly connected to the connection node between the input terminal of the current mirror circuit CM1 and the N-channel differential pair DN1, and the current $I_3$ flows therein. A drain of the P-channel MOS transistor MP7 and a source of the N-channel MOS transistor MN7 are commonly connected and serve as the other terminal of the current source II3. This terminal is commonly connected to the connection node between the input terminal of the current mirror circuit CM2 and the P-channel differential pair DP1, and the current $I_3$ flows out from it. The constant voltage source VP2 is connected between a gate of the P-channel MOS transistor MP7 and the positive voltage power source $V_{DD}$, and a bias is applied to the P-channel MOS transistor MP7. The connection point between the gate of the P-channel MOS transistor MP7 and the constant voltage source VP2 is assumed to be a node BP2. The constant voltage source VN2 is connected between a gate of the N-channel MOS transistor MN7 and the negative voltage power source VSS, and a bias is applied to the N-channel MOS transistor MN7. The connection point between the gate of the N-channel MOS transistor MN7 and the constant voltage source VN2 is assumed to be a node BN2.

The characteristics of the floating constant current source II3 are determined by setting a voltage $V_{BP2}$ of the constant current source VP2 and a voltage $V_{BN2}$ of the constant current source VN2. At first, the voltage $V_{BP2}$ of the constant voltage source VP2 connected to the node BP2 is equal to the sum of the voltage $V_{GS\,(MP7)}$ between the gate and the source of the P-channel MOS transistor MP7 and the voltage $V_{GS\,(MP7)}$ between the gate and the source of the P-channel MOS transistor MP3. Thus, the following equation (1) is met.

$$V_{BP2} = V_{GS(MP7)} + V_{GS(MP3)} \tag{1}$$

The voltage $V_{GS}$ between the gate and the source of the MOS transistor is represented by the following equation (2).

$$V_{GS} = \sqrt{\frac{2I_D}{\beta}} + V_T \tag{2}$$

Here, $$\beta = \frac{W}{L}\mu C_o$$

W indicates a gate width, L indicates a gate length, μ indicates a mobility, Co indicates a gate oxide film capacitance per unit, and $V_T$ indicates a threshold voltage.

When the N-channel MOS transistors MN1 and MN2 of the N-channel differential pair DN1 carry out the amplifying operation, both of the drain currents are equal to each other. Thus, each of the drain currents is $I_2/2$. Also, the bias voltages of the nodes BP2 and BN2 are generally determined such that the drain currents of the P-channel MOS transistor MP7 and the N-channel MOS transistor MN7 of the floating current source II3 are equal to each other. Thus, the following equation (3) can be obtained from the equation (1) by using the equation (2):

$$V_{BP2} = \sqrt{\frac{2I_{D(MP7)}}{\beta_{(MP7)}}} + \sqrt{\frac{4I_{D(MP7)} + I_2}{\beta_{(MP3)}}} + 2V_T \quad (3)$$

Here, $I_{D(MP7)}$ and $\beta_{(MP7)}$ indicate the drain current of the P-channel MOS transistor MP7 and β, respectively, and $I_{D(MP3)}$ and $\beta_{(MP3)}$ indicate the drain current of the P-channel MOS transistor MP3 and β.

This equation (3) can be used to solve $I_{D(MP7)}$. Since the actual equation is very complex, the equation is omitted here. Similarly, with regard to the constant voltage source VN2 connected to the node BN2, the voltage $V_{BN2}$ is determined such that the respective drain currents of the N-channel MOS transistor MN7 and the P-channel MOS transistor MP7 are equal to each other. In this way, the floating constant current source II3 is set.

Figure 6:
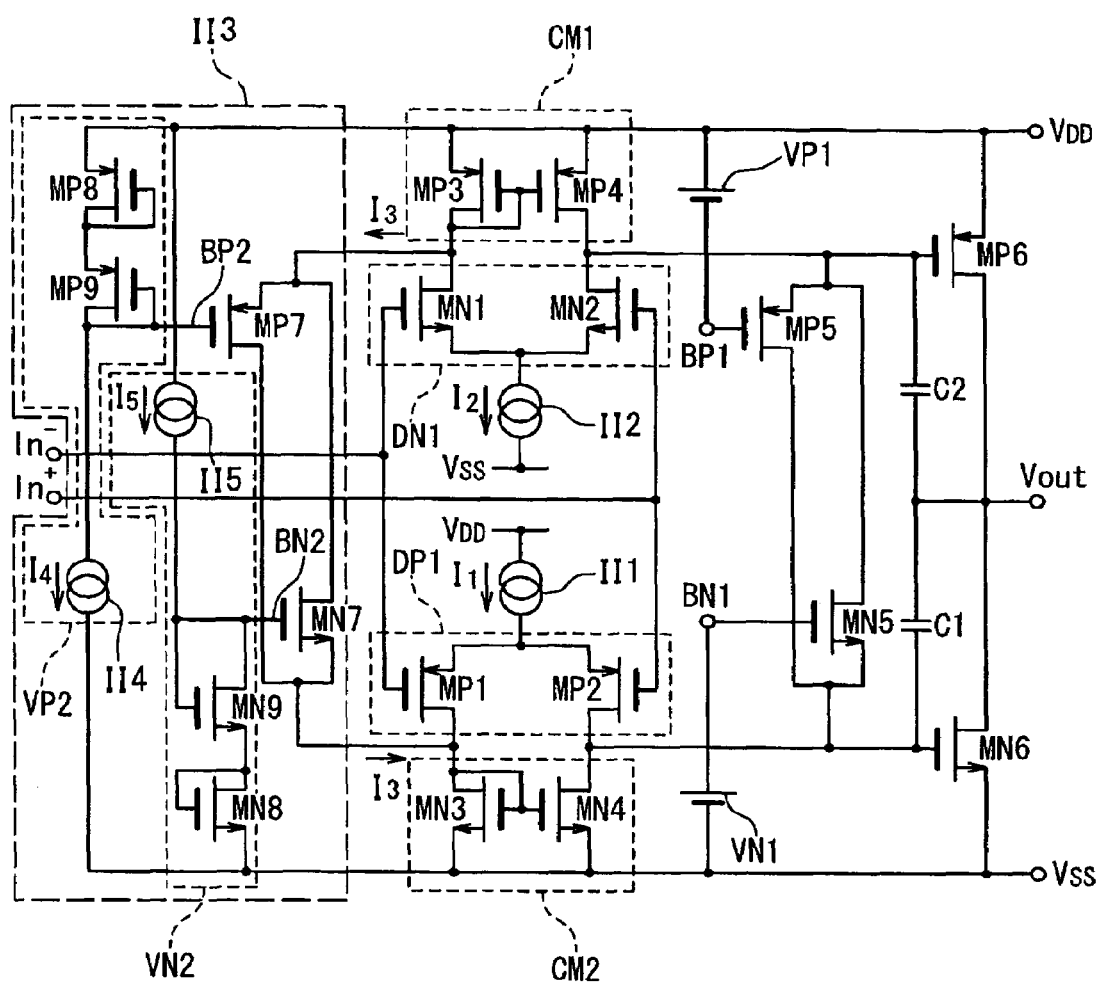
FIG. 6 is a circuit diagram showing a configuration of a constant voltage source VN2 and a constant voltage source VP2 shown in FIG. 4.

Here, the constant voltage sources VP2 and VN2 become strong against the variation caused by the element deviation, because each of them has the configuration in which the two MOS transistors and constant current sources are contained as shown in FIG. 6. Although the circuit configuration will be described later, when the voltage $V_{BP2}$ is determined under this configuration, the item of $[2V_T]$ is picked up. Thus, $[2V_T]$ on the right and left sides of the equation (3) are removed.

With reference to FIG. 6, the constant voltage source VP2 has a P-channel MOS transistor MP8, a P-channel MOS transistor MP9 and a constant current source II4. A source of the P-channel MOS transistor MP8 is connected to the positive voltage power source VDD, and a gate and a drain are commonly connected and further commonly connected to a source of the P-channel MOS transistor MP9. One end of the constant current source II4 is commonly connected to a gate and a drain of the P-channel MOS transistor MP9 and connected to a gate of the P-channel MOS transistor MP7 as a node BP2. The other end of the constant current source II4 is connected to the negative voltage power source $V_{SS}$. The constant current source II4 sends a current $I_4$ from the drain of the P-channel MOS transistor MP9 to the negative voltage power source VSS.

The constant voltage source VN2 has an N-channel MOS transistor MN8, an N-channel MOS transistor MN9 and a constant current source II5. A source of the N-channel MOS transistor MN8 is connected to the negative voltage power source $V_{SS}$, and a gate and drain are commonly connected and further commonly connected to a source of the N-channel MOS transistor MN9. One end of the constant current source II5 is commonly connected to a gate and drain of the N-channel MOS transistor MN9 and connected to the gate of the N-channel MOS transistor MN7 as a node BN2. The other end of the constant current source II5 is connected to the positive voltage power source VDD. The constant current source II5 sends a current $I_5$ from the positive voltage power source VDD to the drain of the N-channel MOS transistor MN9.

With such a connection, the voltage $V_{BP2}$ of the constant voltage source VP2 meets the following equation (4).

$$V_{BP2} = \sqrt{\frac{2I_4}{\beta_{(MP8)}}} + \sqrt{\frac{2I_4}{\beta_{(MP9)}}} + 2V_T \quad (4)$$

Here, $\beta_{(MP8)}$ and $\beta_{(MP9)}$ are βs of the P-channel MOS transistors MP8 and MP9, respectively. Similarly, the voltage $V_{BN2}$ of the constant voltage source VN2 meet the following equation (5).

$$V_{BN2} = \sqrt{\frac{2I_{54}}{\beta_{(MN8)}}} + \sqrt{\frac{2I_5}{\beta_{(MN9)}}} + 2V_T \quad (5)$$

Figure 7:
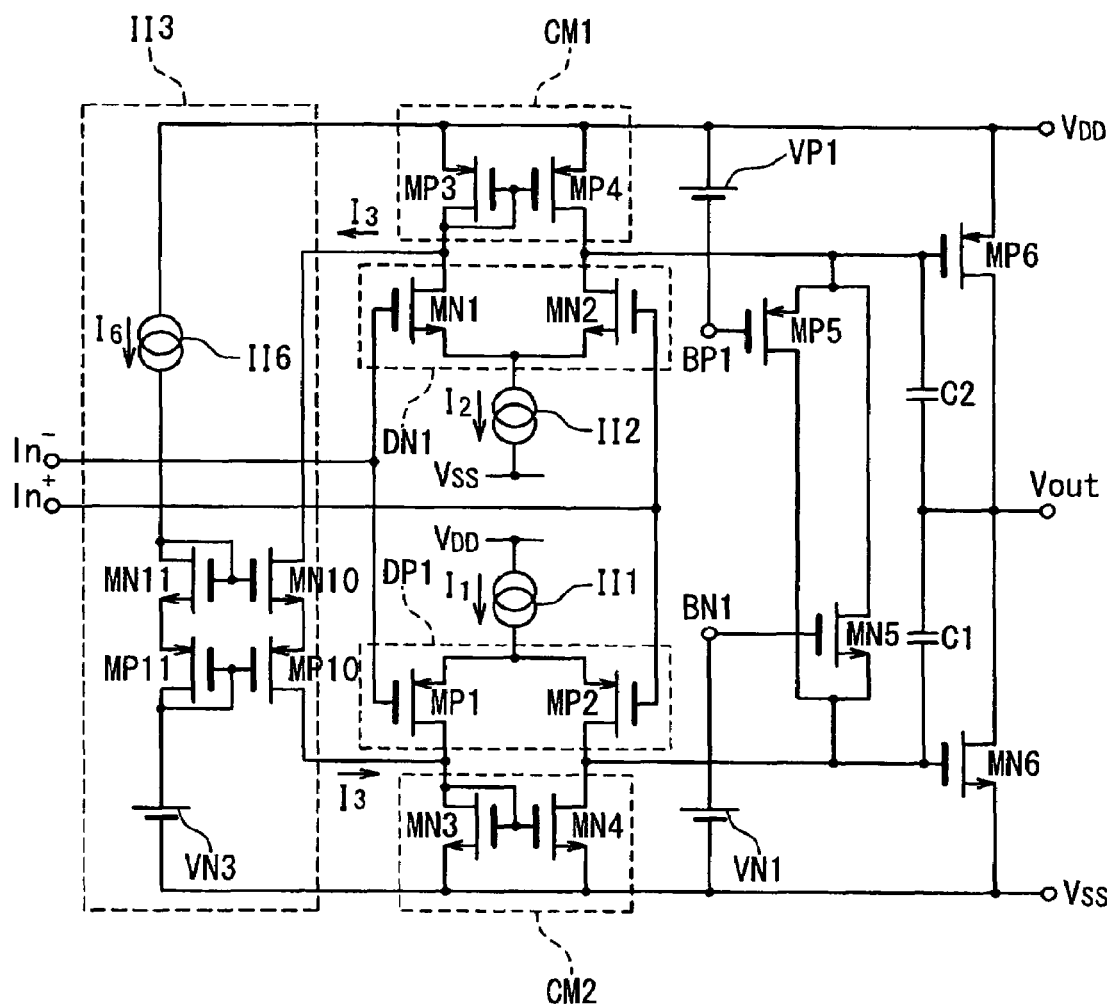
FIG. 7 is a circuit diagram showing another configuration of the floating constant current source shown in FIG. 4.

Here, $\beta_{(MN8)}$ and $\beta_{(MN9)}$ are βs of the N-channel MOS transistors MN8 and MN9, respectively. The items of $[2V_T]$ in the equations (4) and (5) are canceled by the item $[2V_T]$ in the equation (3). Thus, it could be understood that this is strong against the variation caused by the element dispersion FIG. 7 shows an example of another circuit configuration for the floating constant current source II3. In the floating constant current source II3 in FIGS. 5 and 6, for example, if the N-channel differential pair DN1 is turned off in the potential close to the power source, the current $I_2$ on the right side of the equation (3) becomes 0, which brings about the difference in the set current value. FIG. 7 shows the circuit diagram of the differential amplifier using the floating constant current source to solve this difference.

The floating constant current source II3 has a P-channel MOS transistor MP10, an N-channel MOS transistor MN10, a P-channel MOS transistor MP11, an N-channel MOS transistor MN11, a constant voltage source VN3 and a constant current source II6. A gate and a drain of the P-channel MOS transistor MP11 are commonly connected to each other and connected to the constant voltage source VN3. A gate and drain of the N-channel MOS transistor MN11 are commonly connected to each other and connected to the constant current source II6.

The gates of the P-channel MOS transistor MP10 and the P-channel MOS transistor MP11 are commonly connected to each other. The gates of the N-channel MOS transistor MN10 and the N-channel MOS transistor MN11 are commonly connected to each other. The drain of the N-channel MOS transistor MN10 is connected to the input terminal (the drain of the MP3) of the current mirror circuit CM1 serving as the active load of the N-channel differential pair DN1. The drain of the P-channel MOS transistor MP10 is connected to the input terminal (the drain of the MN3) of the current mirror circuit CM2 serving as the active load of the P-channel differential pair DP1. At this time, the respective drains of the N-channel MOS transistor MN10 and the P-channel MOS transistor MP10 correspond to both of the terminals of the floating constant current source II3. The circuit shown in FIG. 7 is same as those shown in FIGS. 5 and 6, excluding the portion of the floating constant current source II3. Thus, the description is omitted.

The floating constant current source II3 shown in FIG. 7 is analyzed. It is supposed that the dimensions of the P-channel MOS transistor MP10 and the P-channel MOS transistor MP11 are same and the dimensions of the N-channel MOS transistor MN10 and the N-channel MOS transistor MN11 are same. A current value of the constant current source II6 is assumed to be $I_6$. In case of the MOS transistor, the drain current and source current are equal to each other, differently from the bipolar transistor. For this reason, the current $I_6$ of the constant current source II6 becomes the drain current of all of the N-channel MOS transistor MN11 and the P-channel MOS transistor MP11. That is, the drain currents of the N-channel MOS transistor MN11 and the P-channel MOS transistor MP11 are equal to each other. Similarly, since the source of the N-channel MOS transistor MN10 is connected to the source of the P-channel MOS transistor MP10, the respective drain currents of the N-channel MOS transistor MN10 and the P-channel MOS transistor MP10 are equal to each other. The sum of a voltage $V_{GS(MN11)}$ between the gate and the source in the N-channel MOS transistor MN11 and a voltage $V_{GS(MP11)}$ between the gate and the source in the P-channel MOS transistor MP11 is applied between the gate of the N-channel MOS transistor MN10 and the gate of the P-channel MOS transistor MP10.

$$V_{GS(MN11)} + V_{GS(MP11)} = V_{GS(MN10)} + V_{GS(MP10)} \quad (6)$$

From the above-mentioned description, when the drain current $I_{D(MN10)}$ of the N-channel MOS transistor MN10 and the drain current $I_{D(MP10)}$ of the P-channel MOS transistor MP10 are calculated, the following equation (7) is met.

$$\sqrt{\frac{2I_6}{\beta_{(MN11)}}} + \sqrt{\frac{2I_6}{\beta_{(MP11)}}} = \sqrt{\frac{2I_{D(MN10)}}{\beta_{(MN10)}}} + \sqrt{\frac{2I_{D(MP10)}}{\beta_{(MP10)}}} \quad (7)$$

Here, $\beta_{(XX)}$ indicates $\beta$ of the transistor XX.

In the equation (7), the dimensions of the P-channel MOS transistor MP10 and the P-channel MOS transistor MP11 are equal to each other, and the dimensions of the N-channel MOS transistor MN10 and the N-channel MOS transistor MN11 are equal to each other. Thus, the following equation is met.

$$\beta_{(MN11)} = \beta_{(MN10)}, \text{ and } \beta_{(MP11)} = \beta_{(MP10)} \quad (8)$$

Also, the drain currents $I_{D(MN10)}$ of the N-channel MOS transistor MN10 and the drain current $I_{D(MP10)}$ of the P-channel MOS transistor MP10 are equal to each other. Then, this is assumed to be $I_D$. From the above equations (7) and (8), $I_D = I_6$.

That is, through the use of this circuit, the design of the floating constant current source is permitted in which the constant current source I6 can be used to freely set the constant current value. Here, it is best that the constant voltage source VN3 is set such that the source of the N-channel MOS transistor MN11 and the source node of the P-channel MOS transistor MP11, which are commonly connected, become $V_{DD}/2$. However, if the N-channel MOS transistor MN11 and the P-channel MOS transistor MP11 are in the pentode operation region, any potential may be used without any problem. For example, even in case of VN3=0, there is no problem on the operation.

In this way, in the operational amplifier of the present invention, since the floating constant current source of the balance type is used, the generation of the offset voltage caused due to the deviation in the element characteristics can be prevented. Thus, the operational amplifier of the present invention is suitable for the amplifier which requires the low output offset voltage and the high precision, and this is suitable for the output amplifier of the LCD source driver.

What is claimed is:

1. An operational amplifier comprising:
   an input stage circuit comprising a first differential pair and a second differential pair which are complementary to each other;
   a first current mirror circuit connected with said first differential pair and configured to function as an active load;
   a second current mirror circuit connected with said second differential pair and configured to function as an active load;
   an output stage circuit having a pair of output transistors connected in series between a higher power supply and a lower power supply;
   an operation point setting circuit configured to set an operation point of said output transistors; and
   a floating constant current source connected to a first connection node between an input terminal of said first current mirror circuit and said first differential pair, and a second connection node between an input terminal of said second current mirror circuit and said second differential pair, and configured to supply a constant current,
   wherein said first current mirror circuit and said second current mirror circuit superimpose an output of said input stage circuit on a current corresponding to the constant current by said floating constant current source to supply to said operation point setting circuit.

2. The operational amplifier according to claim 1, wherein said operation point setting circuit comprises:
   a pair of complementary transistors; and
   a bias setting circuit configured to set a bias to each of said complementary transistors of said pair,
   wherein a current flowing out from said first current mirror circuit flows into said second current mirror circuit through said pair of complementary transistors, and
   wherein operating points of said output transistors are set based on a gate-source voltage in said complementary transistors through said current flowing out from said first current mirror.

3. The operational amplifier according to claim 1,
   wherein said first differential pair comprises a first N-channel MOS transistor and a second N-channel MOS transistor, whose sources are connected to each other in common,
   wherein a gate of said first N-channel MOS transistor and a gate of said second N-channel MOS transistor are connected with differential input terminals, respectively,
   wherein a drain of said first N-channel MOS transistor is connected with an input terminal of said first current mirror circuit, and a drain of said second N-channel MOS transistor is connected with an output terminal of said first current mirror circuit,
   wherein said second differential pair comprises a first P-channel MOS transistor and a second P-channel MOS transistor whose sources are connected with in common,
   wherein a gate of said first P-channel MOS transistor of and a gate of said second P-channel MOS transistor are connected with said differential input terminals, respectively,
   wherein a drain of said first P-channel MOS transistor is connected with an input terminal of said second current mirror circuit, and
   wherein a drain of said second P-channel MOS transistor is connected with an output terminal of said second current mirror circuit.

4. The operational amplifier according to claim 1, wherein said floating constant current source comprises:
   a P-channel MOS transistor;
   an N-channel MOS transistor;
   a first constant voltage source configured to give a bias to a gate of said P-channel MOS transistor; and
   a second constant voltage source configured to give a bias to a gate of said N-channel MOS transistor, wherein a source of said P-channel MOS transistor and a drain of said N-channel MOS transistor are connected to form one of terminals of said floating constant current source, and wherein a drain of said P-channel MOS transistor and a source of said N-channel MOS transistor are connected to form the other terminal of said floating constant current source.

5. The operational amplifier according to claim 4, wherein said first constant voltage source comprises two P-channel MOS transistors connected in series, and wherein said second constant voltage source comprises two N-channel MOS transistors connected in series.

6. The operational amplifier according to claim 4, wherein said first constant voltage source comprises:

a third P-channel MOS transistor;

a fourth P-channel MOS transistor; and a first constant current source, which are connected between higher and lower power supply lines in series, wherein said second constant voltage source comprises:

a third N-channel MOS transistor;

a fourth N-channel MOS transistor; and a second constant current source, which are connected between the higher and lower power supply lines in series, wherein a source of said fourth P-channel MOS transistor is connected with a node to which a gate and a drain of said third P-channel MOS transistor are connected, and one of terminals of said first constant current source is connected with a node to which a gate and a drain of said fourth P-channel MOS transistor are connected, and wherein a source of said fourth N-channel MOS transistor is connected with a node to which a gate and a drain of said third N-channel MOS transistor are connected, and one of terminals of said second constant current source is connected with a node to which a gate and a drain of said fourth N-channel MOS transistor are connected.

7. The operational amplifier according to claim 1, wherein said floating constant current source comprises:

fifth and sixth P-channel MOS transistors whose gates are connected with each other;

fifth and sixth N-channel MOS transistors whose gates are connected with each other;

a third constant voltage source; and a third constant current source, wherein said third constant voltage source, said sixth P-channel MOS transistor, said sixth N-channel MOS transistor and said third constant current source are connected between the higher and lower power supply lines in series, wherein a drain and a gate of said sixth P-channel MOS transistor are connected with each other, and wherein a drain and a gate of said sixth N-channel MOS transistor are connected with each other.

8. An operational amplifier comprising:

an N-channel differential transistor pair connected with input terminals;

a P-channel differential transistor pair connected with the input terminals;

a first current mirror circuit provided between a higher power supply line and said N-channel differential transistor pair to have input and output terminals connected with differential outputs of said N-channel differential transistor pair;

a second current mirror circuit provided between a lower power supply line and said P-channel differential transistor pair to have input and output terminals connected with differential outputs of said P-channel differential transistor pair;

a floating constant current source having one terminal connected with the input terminal of said first current mirror circuit and the other terminal connected with the input terminal of said second current mirror circuit;

a P-channel MOS transistor having a source connected with the output terminal of said first current mirror circuit, a gate connected with a first constant voltage source, and a drain connected with the output terminal of said second current mirror circuit;

an N-channel MOS transistor having a source connected with the output terminal of said second current mirror circuit, a gate connected with a second constant voltage source and a drain connected with the output terminal of said first current mirror circuit;

an output stage P-channel MOS transistor connected between an external output terminal and the higher power supply line and having a gate connected with the output terminal of said first current mirror circuit; and an output stage N-channel MOS transistor connected between the external output terminal and the lower power supply line and having a gate connected with the output terminal of said second current mirror circuit.

9. The operational amplifier according to claim 8, wherein said floating constant current source comprises:

a first constant voltage source connected with the higher power supply line;

a second constant voltage source connected with the lower power supply line;

a P-channel MOS transistor having a source connected with the input terminal of said first current mirror circuit, a gate connected with said first constant voltage source, a drain connected with the input terminal of said second current mirror circuit; and an N-channel MOS transistor having a gate connected with said second constant voltage source, a source connected with the input terminal of said second current mirror circuit and a drain connected with the input terminal of said first current mirror circuit.

10. The operational amplifier according to claim 8, wherein said floating constant current source comprises:

a first N-channel MOS transistor having a gate and a drain connected with in common;

a first P-channel MOS transistor having a source connected with a source of said first N-channel MOS transistor and a gate and a drain connected with in common;

a second N-channel MOS transistor having a gate connected with the gate of said first N-channel MOS transistor and a drain connected with the input terminal of said first current mirror circuit;

a second P-channel MOS transistor having a gate connected with the gate of said first P-channel MOS transistor, a drain connected with the input terminal of said second current mirror circuit and a source connected with the source of said second N-channel MOS transistor;

a constant current source connected between the higher power supply line and the gate and drain of said first N-channel MOS transistor; and a constant voltage source connected with the gate and drain of said first P-channel MOS transistor.

11. The operational amplifier according to claim 1, wherein said operational amplifier further comprises a plurality of constant voltage sources.

12. An operational amplifier comprising:
an input stage circuit comprising a first differential pair and a second differential pair which are complementary to each other;
a first current mirror circuit connected with said first differential pair and configured to function as an active load;
a second current mirror circuit connected with said second differential pair and configured to function as an active load;
an output stage circuit having a pair of output transistors connected in series between a higher power supply and a lower power supply;
an operation point setting circuit configured to set an operation point of said output transistors;
a floating constant current source connected between an input terminal of said first current mirror circuit and an input terminal of said second current mirror circuit, and configured to supply a constant current; and
a plurality of constant voltage sources.

13. The operational amplifier according to claim 12, wherein the floating constant current source comprises:
a P-channel MOS transistor;
an N-channel MOS transistor;
a first constant voltage source configured to give a bias to a gate of the P-channel MOS transistor; and
a second constant voltage source configured to give a bias to a gate of the N-channel MOS transistor.

14. The operational amplifier according to claim 13, wherein a source of the P-channel MOS transistor and a drain of the N-channel MOS transistor are connected to form a first terminal of the floating constant current source, and
wherein a drain of the P-channel MOS transistor and a source of the N-channel MOS transistor are connected to form a second terminal of the floating constant current source.

15. The operational amplifier according to claim 13, wherein the plurality of constant voltage sources comprises:
a first constant voltage source having two P-channel MOS transistors connected in series; and
a second constant voltage source having two N-channel MOS transistors connected in series.

16. The operational amplifier according to claim 15, wherein the first constant voltage source comprises:
a third P-channel MOS transistor;
a fourth P-channel MOS transistor; and
a first constant current source,
wherein the third P-channel MOS transistor, the fourth P-channel MOS transistor, and the first constant current source are connected between the higher and the lower power supply lines in series.

17. The operational amplifier according to claim 16, wherein the second constant voltage source comprises:
a third N-channel MOS transistor;
a fourth N-channel MOS transistor; and
a second constant current source,
wherein the third N-channel MOS transistor, the fourth N-channel MOS transistor, and the second constant current source are connected between the higher and lower power supply lines in series.

18. The operational amplifier according to claim 17, wherein a source of the fourth P-channel MOS transistor is connected with a node to which a gate and a drain of the third P-channel MOS transistor are connected,
wherein one of terminals of the first constant current source is connected with a node to which a gate and a drain of the fourth P-channel MOS transistor are connected,
wherein a source of the fourth N-channel MOS transistor is connected with a node to which a gate and a drain of the third N-channel MOS transistor is connected, and
wherein one of terminals of the second constant current source is connected with a node to which a gate and a drain of the fourth N-channel MOS transistor is connected.

19. The operational amplifier according to claim 12, wherein the floating constant current source comprises:
a fifth and a sixth P-channel MOS transistors;
a fifth and a sixth N-channel MOS transistors;
a third constant voltage source; and
a third constant current source.

20. The operational amplifier according to claim 19, wherein the third constant voltage source, the sixth P-channel MOS transistor, the sixth N-channel MOS transistor, and the third constant current source are connected between the higher and lower power supply lines in series.

* * * * *